# United States Patent [19]

Zega

[11] 4,376,025
[45] Mar. 8, 1983

[54] CYLINDRICAL CATHODE FOR MAGNETICALLY-ENHANCED SPUTTERING

[75] Inventor: Bogdan Zega, Geneva, Switzerland

[73] Assignee: Battelle Development Corporation, Columbus, Ohio

[21] Appl. No.: 388,482

[22] Filed: Jun. 14, 1982

[51] Int. Cl.³ ............................................. C23C 15/00
[52] U.S. Cl. ................................ 204/192 R; 204/298
[58] Field of Search .......................... 204/192 R, 298

[56] References Cited

U.S. PATENT DOCUMENTS

| | | |
|---|---|---|
| 3,838,031 | 9/1974 | Snaper .................................. 204/298 |
| 3,884,793 | 5/1975 | Penfold et al. ................. 204/192 R |
| 3,919,678 | 11/1975 | Penfold ............................... 335/296 |
| 3,995,187 | 11/1976 | Penfold et al. ................. 313/346 R |
| 4,030,996 | 9/1977 | Penfold et al. ................. 204/192 R |
| 4,031,424 | 6/1977 | Penfold et al. ...................... 313/146 |
| 4,179,351 | 12/1979 | Hawton et al. ..................... 204/298 |
| 4,198,283 | 4/1980 | Class et al. ........................... 204/298 |
| 4,221,652 | 9/1980 | Kuriyama ....................... 204/192 R |
| 4,290,877 | 9/1922 | Blickensderfer ............... 204/192 R |

OTHER PUBLICATIONS

"On the Use of Ring Gap Discharge for High Rate Vacuum Cooling", S. Schiller et al., Journal of Vacuum Science Technology, vol. 14, No. 3, May/Jun. 1977.
"Thin Film Processes", (Edited by Vossen & Kern) Academic Press (1978), pp. 76–113, Cylindrical Magnetron Sputtering–J. A. Thorton & A. S. Penfold.
"Advances in High Rate Sputtering with Magnetron--Plasmatron Processing and Instrumentation"–S. Schiller et al.; Thin Solid Films 64 (1979), 455–467.
"End Effects in Cylindrical Magnetron Sputtering Sources"–J. A. Thorton; Journal of Vacuum Science Technology 16(1) Jan./Feb. 1979, pp. 79–82.
"Design and Capabilities of a Novel Cylindrical Post Magnetron Sputtering Source", D. W. Hoffman–Ford Motor Co.; paper presented 4/5/82 in San Diego.

*Primary Examiner*—Arthur P. Demers
*Attorney, Agent, or Firm*—Barry S. Bissell

[57] ABSTRACT

In this cylindrical, magnetically-enhanced, sputtering cathode, the magnetic field at the cathode target is generated by applying an electric current through a hollow electrical conductor disposed within a tubular target, so that the electric current flowing along this conductor induces circular magnetic lines concentrically around its axis. By biasing negatively the tubular target immersed in a low pressure gas, a glow discharge is generated. Electrons, emitted from the target surface are accelerated radially by the electric field, but deviated perpendicularly by the magnetic field. The resulting motion is confined in a spirally-shaped area centered on the conductor axis.

9 Claims, 4 Drawing Figures

CYLINDRICAL CATHODE FOR MAGNETICALLY-ENHANCED SPUTTERING

FIELD OF THE INVENTION

The present invention relates to a cylindrical cathode suitable for the magnetically-enhanced sputtering of targets.

BACKGROUND OF THE INVENTION

The cylindrical magnetically-enhanced controlled sputtering cathode systems for coating tubular substrates being now generally proposed belong to the so-called "cylindrical magnetron sputtering" systems, such that proposed in EP Publication 0 045 822, comprising a magnet assembly disposed behind the back side of a tubular target opposed to the sputtering face for generating magnetic fields having flux lines which project curvilinearly from said sputtering face and return thereto thus forming arched flux portions thereover. During sputtering of the cathode target by bombardment with ions of the plasma generated by the glow discharge between said cathode target and an anode, the secondary electrons emitted by the cathode are restrained by the magnetic field into a spirally elongated path. This elongated path of electrons is, according to Penning's principle, responsible for an increased ionization probability of the present gas and, in consequence, for enhancing the sputtering rate of the target.

With such a magnetron, the permanent magnets must be rotated or swung relative to the target in order that the erosion is uniform. The minimum diameter of the tubular target for receiving the permanent magnets of the magnetron cannot be reduced under a limiting value which can be situated around 30 mm. Taking the cathode dark space into account, it is consequently not possible to coat tubular substrates having a diameter under around 60 mm.

Instead of permanent magnets, internally installed, the magnetic field can be created by external magnets or coils. In this case, the target can be reduced to a much smaller diameter. Such a sputtering device, known as "post magnetron" is however limited to a case, where the substrate to be coated internally is not ferromagnetic.

The present invention provides a cylindrical magnetically enhanced sputtering cathode in which the magnetic field at the cathode target is no longer generated by a magnetron; thus, the target erosion is uniform and no drive system for rotating the magnets is needed.

According to the electromagnetic theory, it is well known that when an electric current flows along a conductor, circular magnetic induction lines are built up concentrically around the conductor axis. The Biot-Savart's law specifies that the field intensity decreases with the first power of the radial distance from the conductor.

By biasing negatively a target surface coaxially disposed around the conductor axis, immersed in a low pressure gas, a glow discharge is generated. Electrons, emitted from the target surface are accelerated radially by the electric field, but deviated perpendicularly by the magnetic field. The resulting motion is confined in a spiral shaped area centered on the conductor axis, the closer it is to the target surface, the stronger is the magnetic field.

By increasing the supply current in the conductor, a contraction of the plasma around the target surface will result. The cathodic dark space is reduced to a very narrow zone and the discharge phenomenon can be maintained even when the target surface is surrounded closely by a cylindrical wall of the substrate to be coated.

SUMMARY OF THE INVENTION

A typical cylindrical, magnetically-enhanced, sputtering cathode, which produces a thin film on the surface of an object, according to the present invention, comprises:
a tubular target;
a hollow electrical conductor disposed within the tubular target;
means for applying an electric current through the conductor which generates a magnetic field around the tubular target; and
means for circulating a liquid coolant through the electrical conductor.

In a typical cathode according to the invention, the ends of the electrical conductor are connected to a low voltage, current source isolated from ground.

Preferably, the sputtering apparatus utilizing said cathode comprises a d.c. high voltage supply source having its negative terminal connected to the low voltage current source and typically said source is an a.c. source.

In a preferred embodiment of the invention, the cathode comprises an annular tight chamber provided between the tubular target and the electrical conductor, the annular tight chamber being connected to a pressurized gas coolant source.

The present invention also relates to a method of producing a thin film onto a substrate within a cylindrical magnetically-enhanced cathodic sputtering apparatus.

DRAWINGS

DETAILED DESCRIPTION

Figure 1:
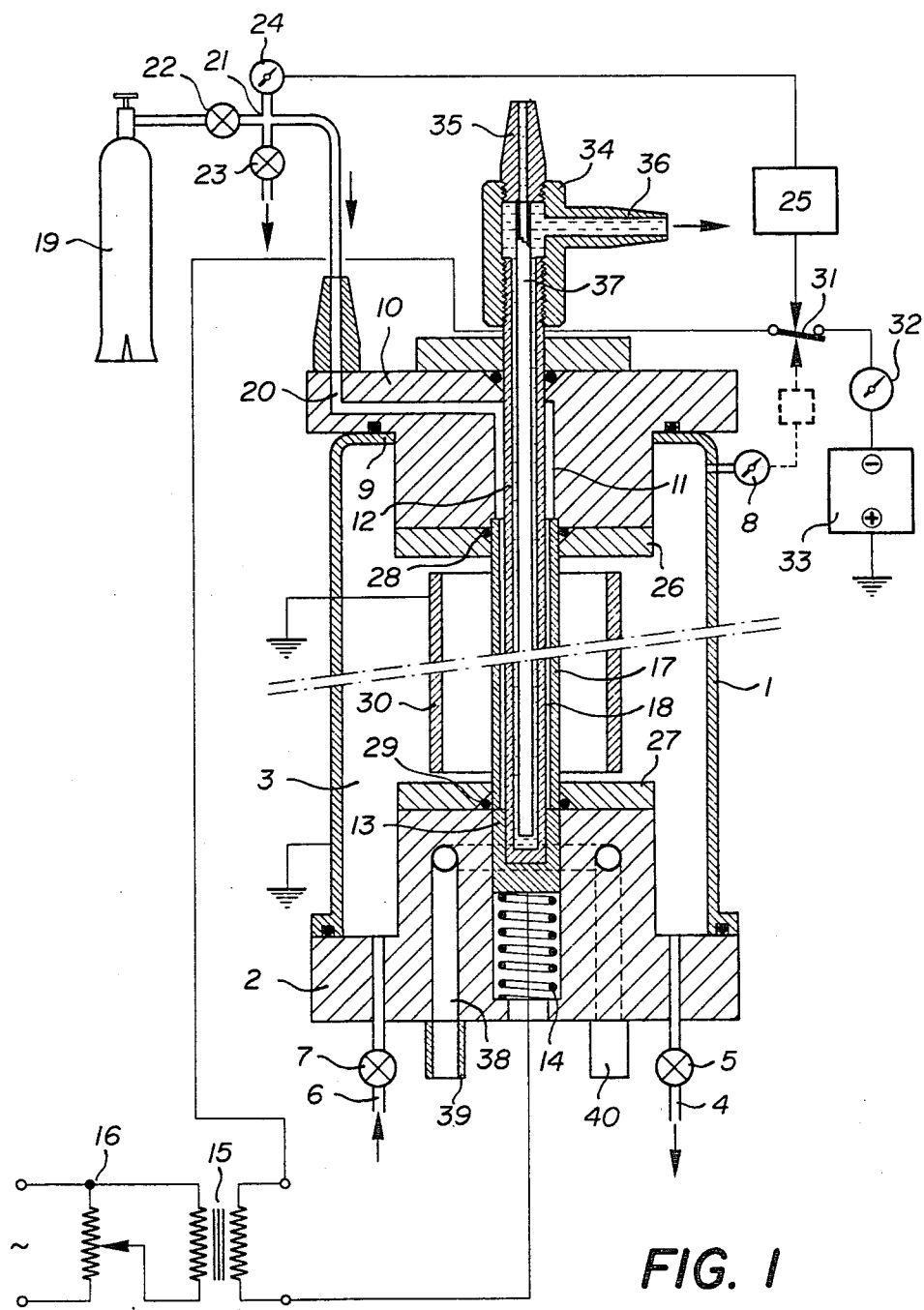
FIG. 1 is a schematic elevational cross-sectional view of a typical sputtering apparatus comprising a cylindrical magnetically-enhanced sputtering cathode according to the invention.

A typical sputtering apparatus embodying the present invention is shown in FIG. 1. This apparatus comprises a bell-jar 1 resting on a support 2, so as to form a sealed enclosure 3. The support 2 is provided with an evacuation 4 connected via a valve 5 to a vacuum pumping device (not shown), and with an admission port 6 connected by a gauged valve 7 to a source of an appropriate gas such as argon (not shown). The bell-jar 3 is further provided with a pressure gauge 8.

Through a central circular opening 9 provided in the top of the bell-jar 3, is introduced a connecting block 10 axially bored by a passage 11 having three diameters defining three sections. An axial straight tubular electrical conductor 12 is fitted through the section of the smallest diameter and extends centrally inside of the sealed enclosure 3 down to the inside of a connecting plunger 13 having an axial cavity, the surface of which is closely fitted with the closed end of this tubular electrical conductor 12. This connecting plunger 13 axially engaged by this closed end with a helical spring 14 and is electrically connected to one terminal of the secondary winding of a low-voltage transformer 15 isolated from ground, the other terminal of which is connected to the other end of the conductor 12. The primary winding of this transformer is connected to an a.c. supply (50 Hz) by a variable transformer 16.

The upper end of a tubular target 17 is fitted in the largest diameter of the passage 11 bored in the connecting block 10, surrounding coaxially the tubular electrical conductor 12, thus providing an annular chamber 18 between them. This annular chamber 18 is also provided, between the tubular electrical conductor 12 and the middle diameter of the passage 11, with an opening the upper end of which is connected to a coolant gas source 19 such as helium, by a duct 20 through a four-branch junction 21 and a gauged valve 22. The two other branches of the junction 21 are respectively connected via a valve 23 to a suitable pumping device (not shown) and via a pressure gauge 24 to the input of a control circuit 25.

The lower end of the tubular target 17 is engaged against the connecting plunger 13. Two holding discs 26 and 27 respectively are screwed around the upper and lower ends of the tubular target 17 into the connecting block 10 and the support 2. Two O-ring gaskets 28 and 29 are tightly fitted around the end of the target 17 and are respectively pressed against the connecting block 10 and the support 2 by annular bevels provided to the end of the axial opening of each holding disc 26 and 27 adjacent respectively to the connecting block 10 and to the support 2, so that the annular chamber 18 is tight and the target 17 can be replaced when it is worn out.

A cylindrical tubular substrate 30 connected to ground is coaxially disposed in the enclosure 3 around the target 17, while the tubular electrical conductor 12 is connected via a switch 31 and an ammeter 32 to the negative terminal of a high-voltage source 33 whose other terminal is also grounded. Thus, the tubular electrical conductor 12 is the cathode whereas the tubular substrate 30 is the anode of the sputtering system. The switch 31 is connected, on the one hand to the output of the control circuit 25 and, on the other hand, to the pressure gauge 8. The control circuit 25 is intended for triggering the opening of the switch 31, as soon as the pressure recorded by the gauge 8 undergoes a sudden decrease with respect to a predetermined value.

The upper end of the tubular electrical conductor 12 is externally threaded and screwed into a coupling member 34 having an inlet port 35, respectively an outlet port 36, connected to a water coolant circuit (not shown). An axial duct 37 prolongs the inlet port 35 through the tubular electrical conductor 12 down to the lower closed end of this conductor, whereas the outlet port 36 communicates with an annular space provided between said axial duct 37 and said conductor 12. A secondary water conduit 38 having an inlet 39 and an outlet 40 connected to a water coolant circuit (not shown) extends through the support 2.

The above-described sputerring apparatus operates in the following manner.

An appropriate target 17 of a length of 200 mm for this example, is fitted around the tubular electrical conductor 12 and the substrate 30 to be coated is placed around it. The sealed enclosure 3 is evacuated and an argon pressure of the order of $10^{-2}$ mbar (1 Pascal) is maintained. Concurrently, the annular chamber 18 is also evacuated through the valve 23 and an helium atmosphere at a pressure of the order of $13.10^2$ Pascal is introduced therein by means of the gauged valve 22. The tubular electrical conductor 12 is supplied by the transformer 15 with an electric current, typically a low-voltage, high intensity current, for example a 0,5 V–1000–2000 A current so that a magnetic field is formed, the lines of which develop concentrically around the tubular conductor 12. The water is circulated through the conductor 12 and the support 2 for cooling purposes.

Further, by biasing negatively the tubular conductor 12 with the high-voltage source using typically a current of 500–1200 V, 0.4 A, a glow-discharge will form between the cathode conductor 12 and the anode substrate 30. Electrons are emitted from the target's surface 17 and are accelerated radially by the electric field, but deviated perpendicularly by the magnetic field. The resulting motion follows a spiral path comprised in a plane perpendicular to the tubular electrical conductor axis 12 and extending to the substrate 30 to be coated. The closer this spiral runs to the target surface, the stronger is the magnetic field. By increasing the supply current in the tubular electrical conductor 12, the contraction of the plasma around the target 17 can be observed. The cathodic dark space is reduced to a very narrow zone and the discharge can be maintained even when the tubular conductor 12 is surrounded closely by a tubular substrate 30.

Figure 2A:
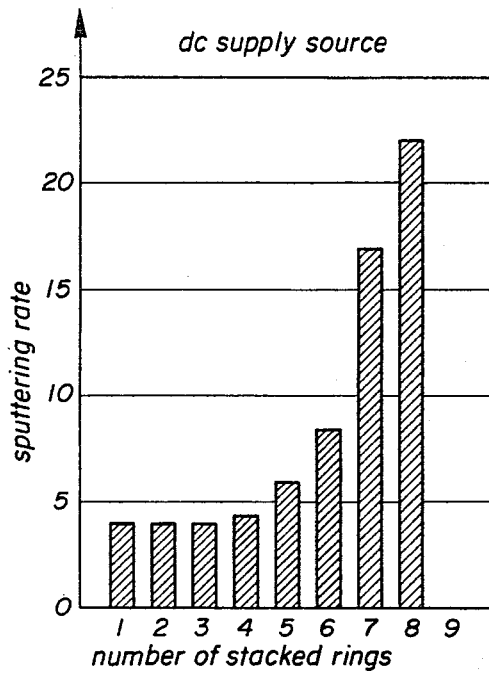
FIGS. 2a and 2b are comparative diagrams of the sputtering rate along the tubular target cathode powered by d.c., respectively a.c., supply current.
Figure 2B:
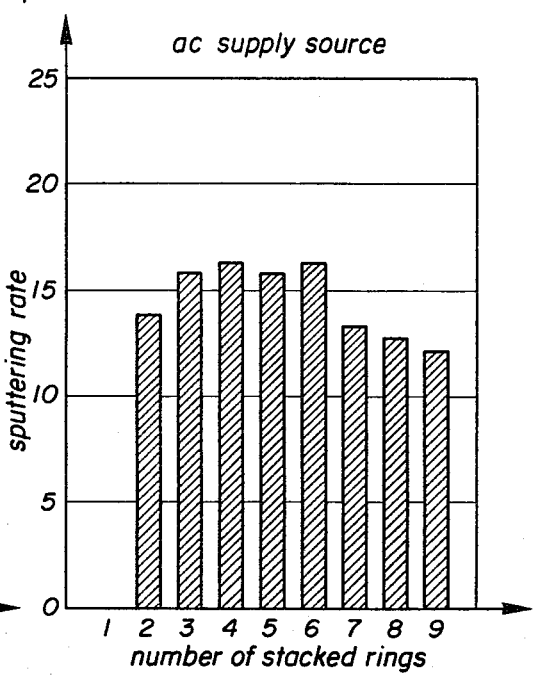

Tests have also been conducted with a d.c. current obtained from a full-wave rectified three-phase current, also regulated on the primary winding with the three-phase variable transformer. The discharge current obtained is substantially lower than when obtained from an a.c. supply. Further, the sputtering rate obtained as a function of the target position along the longitudinal axis of the conductor is very irregular. FIGS. 2a and 2b show comparative diagrams of the sputtering rate, respectively from a d.c. and an a.c. supply source with a target 17 of 10 mm diameter, a bias voltage of 1000 V, a supply current of 1000 A, a discharge current of 200 mA and an Ar pressure of 7.9 Pascal ($6.10^{-2}$ Torr). The values on the abscissa relate to annular stacked rings forming the substrate 30.

Figure 3:
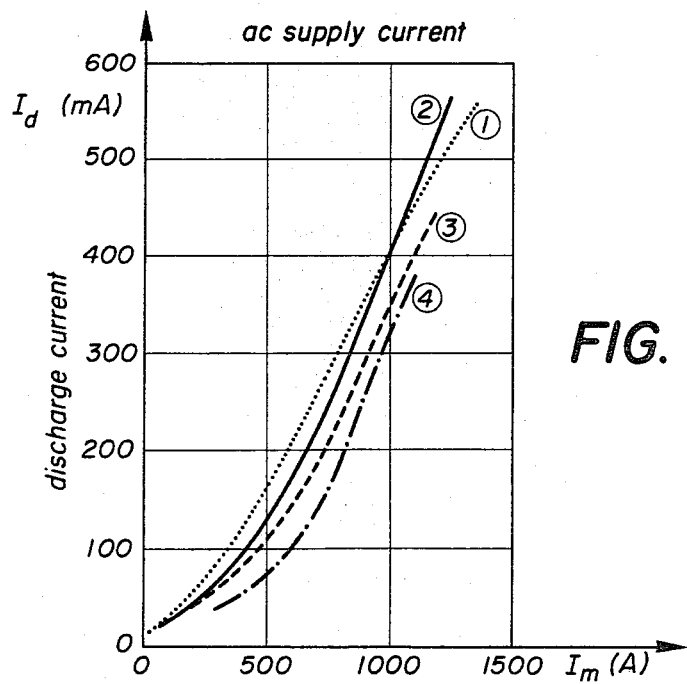
FIG. 3 is a diagram of the discharge current as function of the a.c. power current for various internal diameters of the cylindrical substrate.

FIG. 3 is a diagram of the discharge current as a function of the a.c. supply current and various internal diameters of the substrate 30, the Ar pressure being of 7.9 Pascal ($6.10^{-2}$ Torr) and the bias voltage of 1000 V. The various curves 1 to 4 correspond to an internal substrate diameter of $1=41$ mm, $2=36$ mm of diameter, $3=24$ mm of diameter and $4=20$ mm of diameter.

The maximum observed dissipated power on the targer (10 W/cm$^2$) corresponds to the average value obtained on the cylindrical magnetron.

The principal feature of the described sputtering system is its ability to internally coat tubes of relatively small diameters. Steel tubes of 24 mm diameter have been thus successfully coated. For smaller diameters, the discharge current diminishes progressively. According to the obtained curves, it should be even possible to coat tubes of less than 20 mm diameter at slightly higher pressure and higher magnetic current.

In comparison with a regular magnetron, the described apparatus works under higher pressures. This could have some unfavorable consequences on the quality of coatings. But the possibility of depositing coatings over very short distances will largely compensate for this possible drawback.

I claim:

1. A cylindrical, magnetically-enhanced, sputtering cathode which produces a thin film on the surface of an object, which comprises:
   a tubular target;
   a hollow electrical conductor disposed within the tubular target;
   means for applying an electric current through the conductor which generates a magnetic field around the tubular target; and
   means for circulating a liquid coolant through the electrical conductor.

2. The cylindrical, magnetically-enhanced, sputtering cathode as recited in claim 1 wherein the ends of the electrical conductor are connected to a low voltage, current source isolated from ground.

3. A sputtering apparatus utilizing the cylindrical, magnetically-enhanced, sputtering cathode as recited in claim 2 further comprising a d.c. high voltage supply source having its negative terminal connected to the low voltage current source.

4. The cylindrical, magnetically-enhanced, sputtering cathode as recited in claim 2 wherein the low voltage current source is an a.c. source.

5. The cylindrical, magnetically-enhanced, sputtering cathode as recited in claim 1, further comprising an annular tight chamber provided between the tubular target and the electrical conductor, the annular tight chamber being connected to a pressurized gas coolant source.

6. A method of producing a thin film onto a substrate within a cylindrical, magnetically-enhanced, cathodic sputtering apparatus, which comprises:
   providing a hollow electrical conductor disposed within a tubular target and at least one anode located outside the tubular conductor;
   circulating a liquid coolant through the electrical conductor;
   applying an electric current through the conductor which generates a magnetic field around the tubular target; and
   generating a glow discharge between the tubular target and the anode.

7. The method of producing a thin film onto a substrate as recited in claim 6, wherein the anode is the substrate.

8. The method of producing a thin film onto a substrate as recited in claim 6, wherein the electric current applied through the conductor is a low voltage alternating current.

9. The method of producing a thin film onto a substrate as recited in claim 6, wherein the electric current that is applied through the conductor is a direct current.

* * * * *